US009349491B1

(12) United States Patent
Morgan et al.

(10) Patent No.: US 9,349,491 B1
(45) Date of Patent: May 24, 2016

(54) REPAIR OF MEMORY DEVICES USING VOLATILE AND NON-VOLATILE MEMORY

(71) Applicant: MICRON TECHNOLOGY, INC., Boise, ID (US)

(72) Inventors: Donald M. Morgan, Meridian, ID (US); Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/690,150

(22) Filed: Apr. 17, 2015

(51) Int. Cl.
G11C 17/16 (2006.01)
G11C 29/00 (2006.01)

(52) U.S. Cl.
CPC ............. *G11C 29/76* (2013.01); *G11C 17/16* (2013.01); *G11C 29/78* (2013.01)

(58) Field of Classification Search
CPC .................................. G11C 17/16; G11C 8/08
USPC ............................................... 365/96, 230.06
See application file for complete search history.

(56) References Cited

U.S. PATENT DOCUMENTS

| | | | |
|---|---|---|---|
| 3,886,323 A | 5/1975 | Miller et al. | |
| 5,278,839 A | 1/1994 | Matsumoto et al. | |
| 5,764,878 A | 6/1998 | Kablanian et al. | |
| 5,862,314 A * | 1/1999 | Jeddeloh | G11C 29/76 714/6.13 |
| 5,910,921 A | 6/1999 | Beffa et al. | |
| 5,974,564 A * | 10/1999 | Jeddeloh | G11C 29/76 714/6.13 |
| 6,085,334 A | 7/2000 | Giles et al. | |
| 6,967,878 B2 | 11/2005 | Dono | |
| 7,020,033 B2 | 3/2006 | Nagata et al. | |
| 7,350,119 B1 | 3/2008 | Zuraski, Jr. et al. | |
| 7,437,626 B2 | 10/2008 | Chang et al. | |
| 7,606,102 B2 | 10/2009 | Blodgett | |
| 7,684,266 B2 | 3/2010 | Lee | |
| 7,746,712 B2 | 6/2010 | Kang et al. | |
| 7,768,847 B2 | 8/2010 | Ong et al. | |
| 8,086,916 B2 | 12/2011 | Kopel | |
| 2002/0133769 A1 | 9/2002 | Cowles et al. | |
| 2005/0041491 A1 | 2/2005 | Kyung | |
| 2005/0097383 A1 | 5/2005 | Puri et al. | |
| 2005/0149782 A1 | 7/2005 | McPartland | |
| 2012/0054549 A1 | 3/2012 | Kwan et al. | |
| 2013/0083612 A1 | 4/2013 | Son et al. | |

(Continued)

OTHER PUBLICATIONS

U.S. Appl. No. 14/077,630, filed Nov. 12, 2013, Wilson, et al.
U.S. Appl. No. 14/246,589, filed Apr. 7, 2014, Wilson, et al.
U.S. Appl. No. 14/539,331, filed Nov. 12, 2014, Wilson, et al.

(Continued)

*Primary Examiner* — Michael Tran
(74) *Attorney, Agent, or Firm* — Dorsey & Whitney LLP

(57) ABSTRACT

Apparatus and methods for hybrid post package repair are disclosed. One such apparatus may include a package including memory cells and volatile memory. The volatile memory may be configured to store defective address data corresponding to a first portion of the memory cells that are deemed defective post-packaging. The apparatus may also include a decoder configured to select a second portion of the memory cells instead of the first portion of the memory cells when received current address data corresponding to an address to be accessed matches the defective address data stored in the volatile memory. The apparatus may also include non-volatile memory in the package. The apparatus may also include a mapping logic circuit in the package. The mapping logic circuit may be configured to program the replacement address data to the non-volatile memory subsequent to the defective address data being stored to the volatile memory.

28 Claims, 6 Drawing Sheets

(56) References Cited

U.S. PATENT DOCUMENTS

| | | |
|---|---|---|
| 2013/0223171 A1 | 8/2013 | Kim et al. |
| 2013/0235644 A1 | 9/2013 | Chung |
| 2014/0049854 A1* | 2/2014 | Ho .................... G11B 5/59666 360/77.02 |

OTHER PUBLICATIONS

Cataldo, Anthony, "Virage Logic Readies self-repairing embedded memory," EE Times, Mar. 6, 2001, 2 pages. Available at: http://www.eetimes.com/document.asp?doc_id=1143164&print=yes (accessed, Apr. 10, 2014).

* cited by examiner

REPAIR OF MEMORY DEVICES USING VOLATILE AND NON-VOLATILE MEMORY

BACKGROUND

1. Technical Field

This disclosure relates to memory devices, and more particularly in at least one embodiment to post-packaging repair of a memory device.

2. Description of Related Technology

Memory cells of memory devices such as dynamic random access memories (DRAMs), static RAMs (SRAMs), flash memories, or the like may experience defects leading to errors and/or failures. Memory cells can also fail to operate with sufficient speed, short enough latencies, or the like. In some cases, memory cells may be identified as defective (hereinafter "defective memory cells") after the memory device (e.g., a memory chip) has been packaged, such as in cases where the memory cells were not defective before the packaging process. Examples of packaging include, but are not limited to, encapsulation by epoxy, ceramic packages, metal/glass packages, and the like. After a memory device has been packaged, the memory device may be tested to identify defective memory cells. Addresses mapped (e.g., assigned) to defective memory cells may be remapped (e.g., reassigned) to functional or otherwise more desirable memory cells (e.g., memory cells that have not been identified as defective) so that the memory device may still be effective or meet a desired operational characteristic.

Non-volatile memory (e.g., fuses or antifuses) may be programmed to store data corresponding to one or more addresses mapped to defective memory cells. An antifuse has a high resistance in its initial state. An antifuse may permanently create an electrically conductive path when a relatively high voltage is applied across the antifuse. An antifuse may have a structure similar to that of a capacitor, i.e., two conductive electrical terminals are separated by a dielectric material. To create an electrically conductive path, a relatively high voltage is applied across the terminals, breaking down the interposed dielectric material and forming a conductive link between the antifuse terminals. Creating a conductive path through an antifuse is referred to as "blowing an antifuse."

Certain protocols exist for performing post package repair. Such existing protocols have various drawbacks. Accordingly, a need exists to improve post package repair.

BRIEF DESCRIPTION OF THE DRAWINGS

The embodiments will be better understood from the Detailed Description of Certain Embodiments and from the appended drawings, which are meant to illustrate and not to limit the embodiments.

DETAILED DESCRIPTION OF CERTAIN EMBODIMENTS

Figure 1:
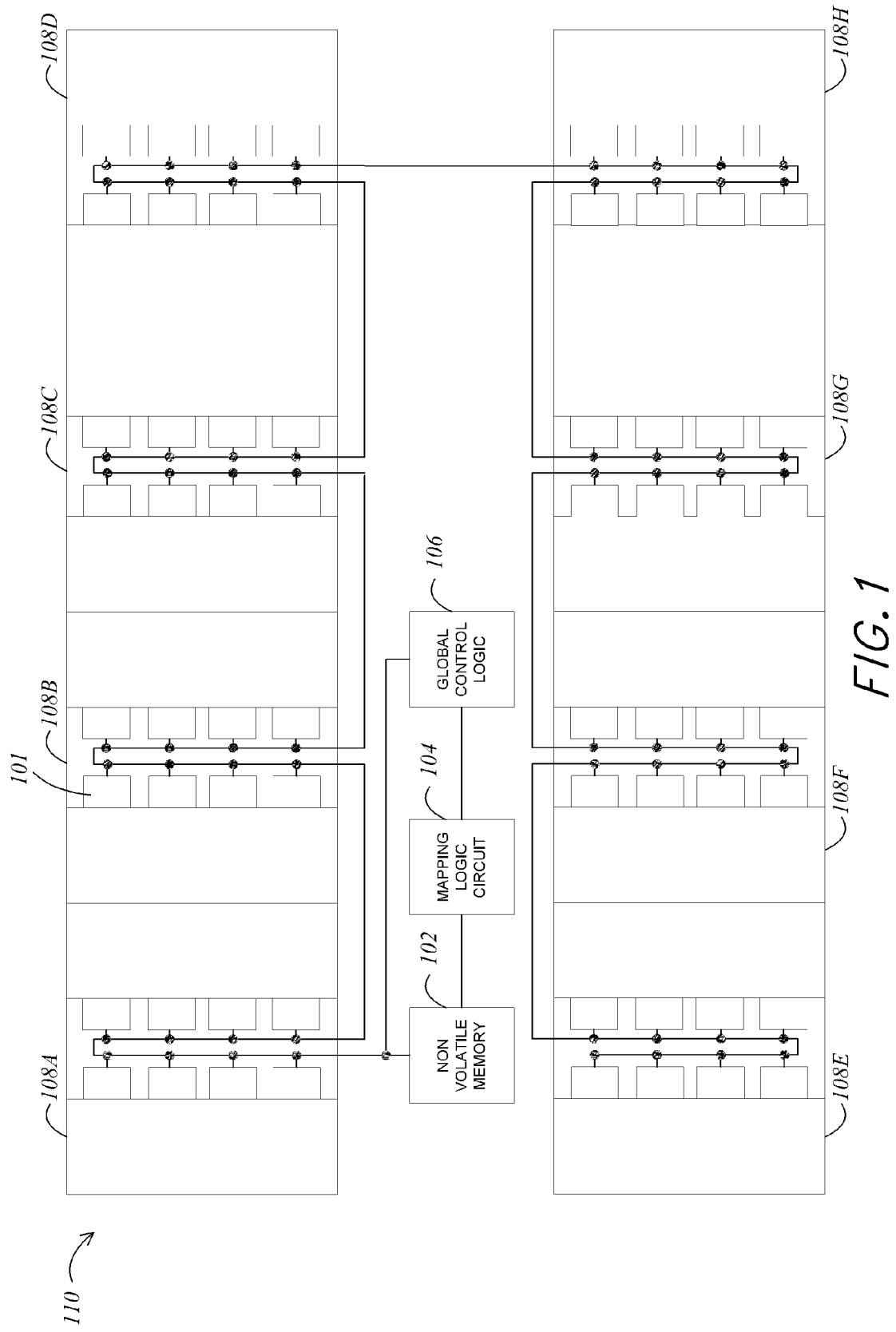
FIG. 1 is a schematic block diagram illustrating a memory device including a plurality of memory banks configured for hybrid post package repair, according to an embodiment.

The following detailed description of certain embodiments presents various descriptions of specific embodiments of the invention. However, the invention may be embodied in a multitude of different ways as defined and covered by the claims. In this description, reference is made to the drawings where like reference numerals may indicate identical or functionally similar elements.

After a memory device has been packaged, it is typically externally accessible only through nodes (e.g., contacts, pins, etc.) of the package, which may make repair of the memory device more difficult than prior to packaging. In addition, some defective memory cells might be identified (e.g., detected) after the memory device has been packaged and assembled into a larger unit, such as a dual-inline memory module (DIMM), flash memory card, smart phone, tablet computer, or the like.

Generally described, aspects of the present disclosure relate to repair of the memory device using both volatile and non-volatile memory. A repair using volatile memory can be implemented followed by automatically programming defective and/or replacement address data to non-volatile memory. Replacement address data can be address data of one or more memory cells to replace one or more designated memory cells. As discussed above, memory cells of a memory device may be deemed defective for a particular purpose post packaging. Post package repair can include repairing the memory device so that functional or otherwise more desirable memory cells, as opposed to defective memory cells (which can include, but is not limited to, functional cells that are deemed less desirable for a particular reason, including speed or another operational characteristic), are utilized. Post package repair of the memory device may be performed in response to a discovery of defective memory cells by remapping addresses of the memory device from the defective memory cells to functional or otherwise more desirable memory cells. Post package repair is desirable for reasons such as to improve overall yield and to reduce cost.

Typically, replacement address data may be stored in non-volatile memory of the memory device. However, programming replacement address data to the non-volatile memory, such as fuses or anti-fuses, may require a significant amount of time (for example, about 200 ms). While replacement address data is being programmed to the non-volatile memory, the memory device can prevent a memory bank associated with the replacement address data from being accessed (e.g., programmed and/or read) to prevent defective memory cells from being accessed. This can result in an undesirable impact on performance of the memory device. On the other hand, storing defective address data in volatile memory can implement repair faster than repair that involves programming replacement address data to non-volatile memory. Defective address data is address data that refers to one or more addresses of memory cells for which replacement is designated. Soft post package repair can refer to a non-persistent method of post package repair and may involve storing defective address data in volatile memory of the memory device after the memory device is packaged. However, with soft post package repair, data stored in volatile memory is lost when a memory device is powered off. Accordingly, with soft post package repair, defective address data is programmed to volatile memory each time the memory device is powered on.

Hybrid post package repair, which includes features of soft post package repair and post package repair that involves storing replacement address data in non-volatile memory, enables both fast repair (e.g., by virtue of using volatile memory) and persistent repair (e.g., by using non-volatile memory). As used herein, post package repair using volatile memory may be referred to as soft post package repair while post package repair using non-volatile memory may be referred to as hard post package repair.

In certain embodiments, hybrid post package repair may be implemented by issuing a second post package repair command for initiation of hard post package repair after issuing a first post package repair command for initiation of soft post package repair for memory cells of a particular memory bank of the memory device. The timing between the issuance of the first post package repair command for soft post package repair and the second post package repair command for hard post package repair may be adjusted as desired for efficient implementation of post package repair commands. In one embodiment, timing between the issuance of the first post package repair command for soft post package repair and the second post package repair command for hard post package repair may be calibrated by logic so that soft post package repair has completed (or at least is initiated) prior to initiating hard post package repair so that system resources are focused on an immediate return to service. In another embodiment, timing between the issuance of the first post package repair command for soft post package repair and the second post package repair command for hard post package repair may be implemented by pipelining the post package repair commands such that a certain amount of soft post package repair is undertaken (such as by initiating a certain number of first post package repair commands for soft post package repair) before hard post package repair is initiated. In particular embodiments, the issuance of the first post package repair command for soft post package repair and the issuance of the second post package repair command for hard post package repair may occur automatically after a hybrid post package repair command is issued.

Hybrid post package repair may occur in any memory device that includes memory cells, such as a memory device that includes a plurality of memory banks that each contains a memory array of memory cells. Each of the memory arrays may include portions (e.g., rows) of redundant memory cells that may be used to replace corresponding portions (e.g., rows) of memory cells that are deemed to be defective within each memory bank.

Each of the memory banks of the memory device may include access logic, discussed further below, that includes volatile memory (such as registers, flip flops, latches, SRAM, DRAM, or the like). The volatile memory may be configured to store address data identifying memory cells of the memory bank. The address data stored in the volatile memory may include defective address data identifying a portion of the memory cells that are deemed to be defective memory cells. The defective address data may be received responsive to entering a post package repair start mode. Each of the memory banks may also include a match logic circuit. The match logic circuit may be configured to receive current address data identifying memory cells to be accessed. The match logic circuit may also be configured to determine whether the current address data matches the defective address data. Each of the memory banks may also include a decoder. The decoder may be configured to select a portion of the memory cells that are functional and/or otherwise more desirable to be accessed instead of the defective memory cells when the current address data matches the defective address data.

The memory device may also include non-volatile memory. The non-volatile memory may be configured to store replacement address data identifying memory cells of one or more of the memory banks. The memory device may also include a mapping logic circuit. The mapping logic circuit may be configured to program the replacement address data in the non-volatile memory. Programming the replacement address data in the non-volatile memory allows for remapping an address of the memory device from defective memory cells to functional or more otherwise more desirable memory cells. Programming the replacement address data to the non-volatile memory may occur subsequent to the defective address data being stored in the volatile memory and may also occur while other memory cells in a memory bank that includes the memory cells deemed defective are accessible.

Accordingly, hybrid post package repair enables soft post package repair using volatile memory to be performed and hard post package repair using non-volatile memory to subsequently be performed. Soft post package repair enables post package repair operations to occur in a similar amount of time as other memory operations (such as read and/or write operations). This may be advantageous as hard post package repair may involve blowing antifuses and/or blowing fuses. Blowing an antifuse may take on the order of 200 ms in current technologies. Such a delay may undesirably impact performance of a memory, as other memory operations may be performed on the order of 10 s of nanoseconds (ns) (e.g., in about 15 ns or about 20 ns) in current technologies. At the same time, by also having hard post package repair implemented after a soft post package repair solution is in place, post package repairs will not be lost when power is interrupted at the memory device.

Hybrid post package repair may be controlled by global control logic. The global control logic may be internal or external to the memory device (or a combination thereof). The global control logic may coordinate hybrid post package repair by providing signals to the mapping logic circuit and/or the memory banks. By providing signals to the mapping logic circuit and/or the memory banks, the global control logic may provide information to the mapping logic circuit and/or the memory banks such as replacement address data, defective address data or current address data in order to coordinate hybrid post package repair. The global control logic may also include a mode register where the post package repair start mode may be entered responsive to a change in a value stored in the mode register.

In an embodiment, hybrid post package repair may repair a memory device by remapping an address that had been previously remapped to a defective group of redundant memory cells. For example, a group of redundant memory cells to which an address has already been remapped could be deemed defective post packaging. In one such embodiment, the address may be remapped to a different group of redundant memory cells.

Hybrid post package repair discussed herein may be compatible with existing post package repair protocols. For instance, the post package repair discussed herein may be implemented with existing programmable elements banks, such as antifuse banks and/or fuse banks, used for pre-packaging and/or post package repair. Defective redundant memory cells may be repaired in accordance with the principles and advantages discussed herein. The methods and circuits of post packaged repair provided herein may be applied to a wide variety of memory devices, such as DRAMs, SRAMs, and NAND flash memories. In addition, circuit implementations of the post package repair discussed herein may consume a relatively small area.

In the context of this document, a group of commonly coupled memory cells may correspond to, for example, a "row" of memory cells (which is also sometimes referred to herein as a "row of memory"). The group of commonly coupled memory cells may alternatively correspond to a "column" of memory cells. Repairing a row of memory may refer to, for example, reassigning the address previously assigned to a defective row of memory to another row of memory. "Programming," "enabling," and "disabling" a redundant row may mean, for example, programming, enabling, or disabling a group of redundant memory cells.

FIG. 1 is a schematic block diagram illustrating a memory device 110 configured for hybrid post package repair, according to an embodiment. As illustrated, the memory device 110 includes a plurality of memory banks 108A-H. The illustrated memory device 110 includes eight memory banks 108A-H, although any suitable number of memory banks can be implemented in accordance with the principles and advantages discussed herein. Each of the memory banks 108A-H may include access logic 101 configured to control access to the memory cells of the memory banks 108A-H. The access logic 101 will be discussed in more detail in FIG. 2A below. Each of the memory banks 108A-H may be in communication with non-volatile memory 102, which might be an array of fuses and/or antifuses that is common to the memory banks. The non-volatile memory 102 may be configured to store address data identifying memory cells of each of the memory banks 108A-H. The non-volatile memory 102 may be connected with the mapping logic circuit 104 configured to program address data (as replacement address data) in the non-volatile memory 102. Each of the memory banks 108A-H may also be in communication with the global control logic 106. The global control logic 106 may coordinate hybrid post package repair by providing signals to the mapping logic circuit 104 and/or one or more of the memory banks 108A-H.

Storage of address data identifying memory cells of each of the memory banks 108A-H in the non-volatile memory 102 may be advantageous in allowing for more efficient utilization of memory device system resources in the performance of hybrid post package repair. For example, centralizing the storage of the address data in a common array of non-volatile elements (such as fuses or anti-fuses) enables the memory device to access address data for all of the memory banks in one central location rather than locally at each memory bank. Also, space within each memory bank that may otherwise be utilized for storage of address data in the non-volatile memory is freed for other uses, such as for circuitry related to soft post package repair. Furthermore, narrow bus technology may be utilized to link the non-volatile memory 102 to each of the memory banks 108A-H in a more effective and space effective manner than locating such non-volatile memory at the memory banks.

Figure 2A:
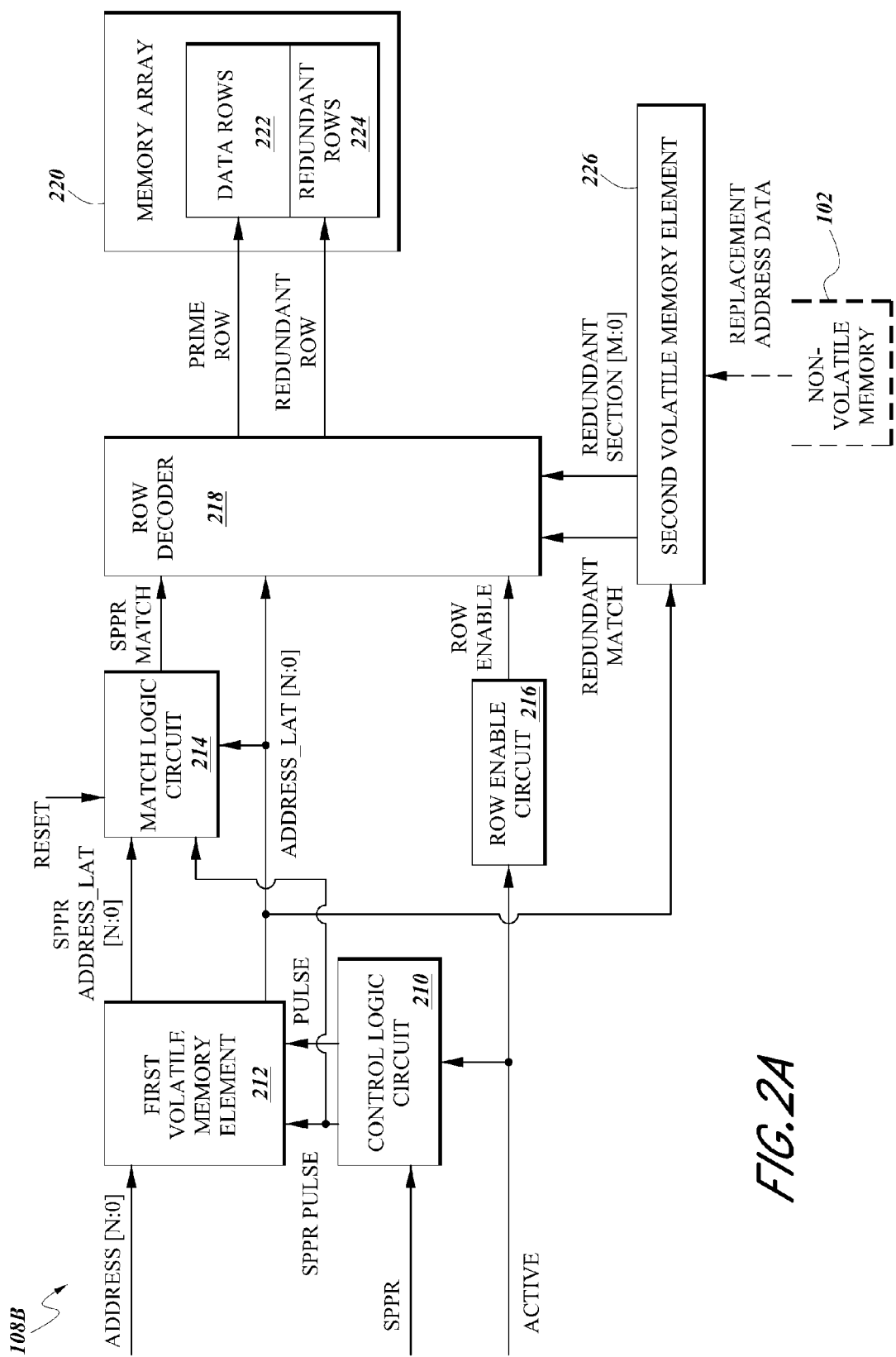
FIG. 2A is a schematic block diagram illustrating a memory bank of the plurality of memory banks of FIG. 1 configured for hybrid post package repair, according to an embodiment.

FIG. 2A is a schematic block diagram illustrating a memory bank of the plurality of memory banks of FIG. 1, according to an embodiment. The memory bank 108B may include a memory array 220 comprising data rows 222 and redundant rows 224. The memory bank 108B may also include access logic 101, such as a control logic circuit 210, a first volatile memory element 212, a match logic circuit 214, a row enable circuit 216, a row decoder 218 and a second volatile memory element 226. The memory bank 108B may include more or fewer elements than illustrated in FIG. 2.

Hybrid post package repair may include performing features of soft post package repair. For example, the control logic circuit 210 may receive a hybrid post package repair signal, such as a soft post package repair signal SPPR, and an activate signal Activate as inputs from the global control logic 106 (illustrated in FIG. 1) and generate a pulse signal Pulse and a hybrid post package repair pulse, such as a soft post package repair pulse SPPR Pulse. Both of these pulse signals may be asserted for a sufficient amount of time for volatile memory elements to capture data. Then, the control logic circuit 210 may de-assert these pulse signals after the data has been captured.

The soft post package repair signal SPPR may be asserted to enter a soft post package repair mode of operation. When the memory bank 108B is operating in the soft post package repair mode, the activate signal Activate may be asserted when defective address data is programmed to the memory bank 108B. The control logic circuit 210 may assert the soft post package repair pulse SPPR Pulse responsive to the activate signal Activate being asserted when the memory bank 108B operates in the soft post package repair mode. The control logic circuit 210 may assert the pulse signal Pulse responsive to the activate signal Activate being asserted when the memory bank 108B operates in a mode of operation other than the soft post package repair mode.

The first volatile memory element 212 may receive address data Address[N:0] and store the address data Address[N:0] from the global control logic 106. The first volatile memory element 212 may comprise any suitable type of volatile memory to store the address data Address[N:0]. The first volatile memory element 212 may include a first group of volatile memory and a second group of volatile memory. These groups of volatile memory may be logically separate from each other. In some instances, these groups of volatile memory may also be physically separate from each other. The first group of volatile memory may store defective address data. The address data Address[N:0] may be stored in the first group of volatile memory as defective address data when the soft post package repair pulse signal SPPR Pulse is asserted. The second group of volatile memory may store current address data corresponding to an address of memory cells of the memory array 220 to be accessed (e.g., read, written or otherwise programmed). The address data Address[N:0] may be stored in the second group of volatile memory when the pulse signal Pulse is asserted.

The match logic circuit 214 may compare address data from the first group of volatile memory SPPR Addr_Lat[N:0] with address data from the second group of volatile memory Addr_Lat[N:0]. The match logic circuit 214 may generate the soft post package repair match signal SPPR Match responsive to (e.g., based at least in part on) the comparison. The soft post package repair match signal SPPR Match may be asserted to indicate that the address of the memory cells to be accessed in the memory array 220 matches a defective address stored in the first volatile memory element 212. When the current address data for memory cells to be accessed does not match defective address data stored in the first volatile memory element 212, the soft post package repair match signal SPPR Match may be de-asserted. The match logic circuit may also de-assert the soft post package repair match signal SPPR Match responsive to a reset signal Reset.

The row enable circuit 216 may include circuitry configured to control activating a row of the memory array 220. The row enable circuit 216 may receive the activate signal Activate and provide a row enable signal Row Enable to the row decoder 218. The row enable circuit 216 may provide a delay in enabling the row decoder 218 after the activate signal Activate is asserted. This may enable the row decoder 218 to select a row of the memory array 220 when address data and match signals are ready to provide a selected row address of the memory array 220, which may be an address remapped to a redundant row of the redundant rows 224 to repair a defective data row of the data rows 222 or a defective redundant row of the redundant rows 224.

The row decoder 218 may decode the address of the memory cells to be accessed to select a row of memory cells in the memory array 220 to which the address is mapped. The selected row may be a data row of the data rows 222 when the address is not known to be defective. For example, when the row enable signal Row Enable is asserted and the address does not match a defective address stored in either first volatile memory element 212 or second volatile memory element 226, a prime row signal Prime Row may be asserted to activate a row of the data rows 222 mapped to the current address data that indicates the address as the selected row. The row decoder 218 may prevent defective data cells from being activated responsive to the soft post package repair match signal SPPR Match from the match logic circuit 214 and/or a redundant match signal Redundant Match from the second volatile memory element 226.

In one embodiment, the row decoder 218 includes logic that can select a particular row of the Redundant Rows 224 when there is an SPPR match and prevent the replacement address data from non-volatile memory 102 from selecting other redundant rows when there is an SPPR match. This can prioritize a soft post package repair match over a hard post package repair match.

The second volatile memory element 226 may receive address data from the non-volatile memory 102. The address data may be provided to the second volatile memory element 226 from the non-volatile memory 102 as described in connection with FIG. 1. The address data may identify addresses of defective memory cells in the memory array 220 (defective address data) and also identify memory cells to replace the defective memory cells in the memory array 220 (replacement address data). The second volatile memory element 226 may compare address data corresponding to an address Address_Lat[N:0] (e.g., current address data) with the defective address data stored in the second volatile memory element 226 to determine whether the address corresponds to an address of a defective memory cell in the memory array 220. The second volatile memory element 226 may generate a redundant match signal Redundant Match indicative of whether the address Address_Lat[N:0] matches a defective memory cells in the memory array 220. The second volatile memory element 226 may provide replacement address data Redundant Section [M:0] to select a row of the redundant rows 224 to which the address has been remapped (as indicated by the replacement address data).

When the current address data matches defective address data stored in the first volatile memory element 212 and/or defective address data stored in the second volatile memory element 226, the row decoder may decode the replacement address data to select a redundant row of the redundant rows 224. A redundant row signal Redundant Row may be asserted to activate a row of the redundant rows 224 mapped to the address as the selected row. Responsive to the soft post package repair match signal SPPR Match being asserted, a different row of the redundant rows 224 may be activated instead of a row of the redundant rows 224 that would have been activated if only the redundant match signal Redundant Match had been asserted.

For example, responsive to the redundant match signal Redundant Match being asserted, the row decoder 218 may decode redundant row address data Redundant Section[M:0], provided by the second volatile memory element 226 as corresponding to the address, to select a redundant row of the redundant rows 224 to which a defective address has been originally remapped. Responsive to the soft post package repair match signal SPPR Match indicating that the address matches a defective address stored in the first volatile memory element 212, the row decoder 218 may select a different redundant row of the redundant rows 224 instead, such as in a case where the redundant row to which the defective address had been originally remapped has later been identified as defective. For example, as discussed above, soft post package repair is initiated prior to hard post package repair. Thereby, after hard post package repair is completed, soft post package repair of the same memory cells is not required. However, during soft post package repair, hard post package repair at the non-volatile memory 102 might not yet be completed. Therefore, soft post package repair takes priority over hard post package repair when the address as provided by hard post package repair (redundant row address data Redundant Section[M:0]) matches a defective address stored in the first volatile memory element 212 as indicated by the soft post package repair match signal SPPR Match. Alternatively or additionally, the soft post package repair can fix defective memory from the redundant row 224 and override a previous repair stored in non-volatile memory pre-packaging and/or post-packaging. The row decoder 218 can prioritize the soft post package repair over the hard post package repair. Accordingly, storing the defective address data in the first volatile memory element 212 may be used to prevent a defective memory cell of the redundant rows 224 from being selected.

The memory array 220 may include volatile or non-volatile memory cells. Some examples of memory cells that may be implemented in the memory array 220 include DRAM cells, SRAM cells, flash memory cells, such as NAND flash memory cells, phase change memory cells, and the like. As illustrated, the memory array 220 includes data rows 222 and redundant rows 224. The redundant rows 224 may be used to replace defective data rows 222 or a defective redundant row.

As discussed above, FIG. 2A illustrates one memory bank 108B of the plurality of memory banks in the memory device of FIG. 1. In certain embodiments, some or all of the circuits illustrated in FIG. 2A may be replicated in each of the plurality of memory banks of FIG. 1. Accordingly, soft post package repair may be a per memory bank solution. In one embodiment, multiple banks of the memory device may simultaneously perform soft post package repair. Alternatively or additionally, two or more memory banks of the memory device may sequentially perform soft post package repair.

Figure 2B:
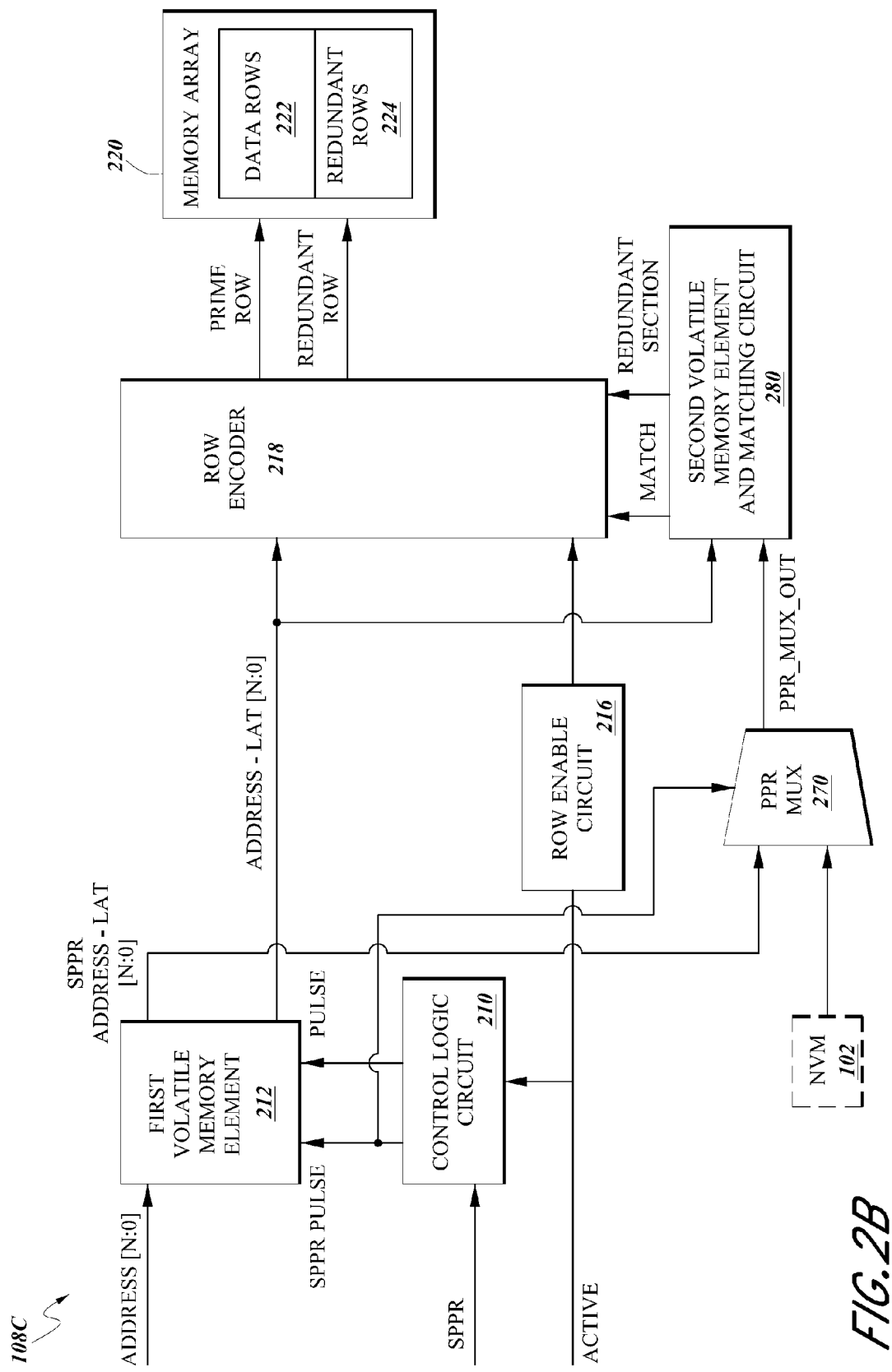
FIG. 2B is a schematic block diagram illustrating a memory bank of the plurality of memory banks of FIG. 1 implemented with a combined second volatile memory element and matching circuit, according to an embodiment.

FIG. 2B is a schematic block diagram illustrating a memory bank 108C of the plurality of memory banks of FIG. 1 implemented with a combined second volatile memory element and matching circuit 280, according to an embodiment. FIG. 2B differs from FIG. 2A in that FIG. 2B includes a combined second volatile memory element and matching circuit 280 and a PPR mux 270. The combined second volatile memory element and matching circuit 280 can implement the functionalities of the match logic circuit 214 and the second volatile memory element 226 of FIG. 2A. The combined second volatile memory element and matching circuit 280 can also prioritize a SPPR match over a previous SPPR match, prioritize a hard PPR match over a previous hard PPR match, prioritize an SPPR match over a hard PPR match, or any combination thereof.

As illustrated, the PPR mux 270 receives address data from the non-volatile memory 102. This address data may be provided to the PPR mux 270 from the non-volatile memory 102 as described in connection with FIG. 1. The address data received from the non-volatile memory 102 may identify addresses of defective memory cells in the memory array 220 (defective address data) and also identify memory cells to replace the memory cells in the memory array 220 (replacement address data). The PPR mux 270 may also receive data from first volatile memory element 212, such as defective address data that identifies defective memory cells in the memory array 220. The PPR mux 270 may also receive the soft post package repair pulse SPPR Pulse from the control logic circuit 210. The PPR mux 270 may pass the data from the first volatile memory element 212 when the soft post package repair pulse SPPR Pulse is asserted and pass the data from the non-volatile memory 102 when the soft post package repair pulse SPPR Pulse is not asserted.

The combined second volatile memory element and matching circuit 280 may receive the output from the PPR Mux 270 PPR_Mux_Out and the current address data Address_Lat[N:0] from the first volatile memory element 212. The second volatile memory element and matching circuit 280 may compare the current address data Address_Lat[N:0] with the defective address data stored to determine whether the current address Address_Lat[N:0] corresponds to an address of a defective memory cell in the memory array 220. The second volatile memory element and matching circuit 280 may generate a match signal Match indicative of whether the current address Address_Lat[N:0] matches a defective memory cell in the memory array 220. The second volatile memory element and matching circuit 280 may provide replacement address data Redundant Section [M:0] to select a row of the redundant rows 224 to which the defective address has been remapped.

Figure 2C:
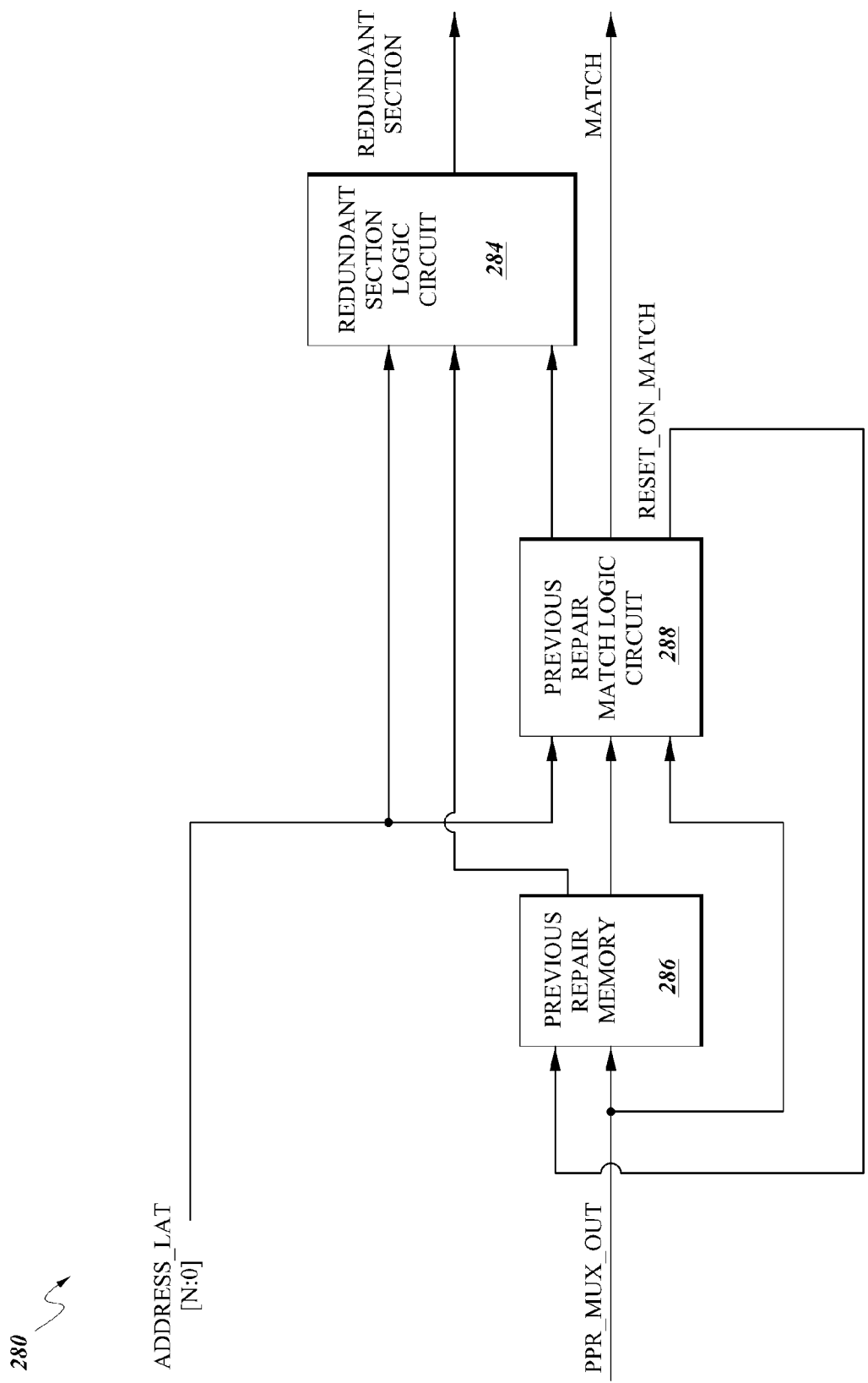
FIG. 2C is a schematic block diagram illustrating the combined second volatile memory element and matching circuit of FIG. 2B, according to an embodiment.

FIG. 2C is a schematic block diagram illustrating the combined second volatile memory element and matching circuit 280 of FIG. 2B, according to an embodiment. The illustrated combined second volatile memory element and matching circuit 280 includes a redundant section logic circuit 284, a previous repair memory 286 and a previous repair match logic circuit 288.

The previous repair memory 286 can store information associated with previous repairs, such as previous defective address data and/or previous replacement address data associated with previous repairs. Before data is stored to the previous repair memory 286, the previous repair match logic circuit 288 can determine whether a defective address provided by the PPR mux 270, via PPR_Mux_Out, has previously been repaired.

The previous repair match logic circuit 288 can receive from the PPR mux 270 (PPR_Mux_Out) the defective address data, the previous defective address data and previous replacement address data of previous repairs from the previous repair memory 286. The previous repair match logic circuit 288 can compare the defective address data from the PPR mux 270 with the previous defective address data and/or the previous replacement address data. If the defective address data from the PPR Mux 270 matches with the previous defective address data or the previous replacement address data during the loading of an SPPR address, then a Reset on Match signal can be asserted to the previous repair memory 286 so that the previous repair memory 286 can disable the previous repair and/or store new replacement address data to replace the previous replacement address data associated with the defective address data from the PPR mux 270 (PPR_Mux_Out). This new replacement address data and the defective address data from the PPR mux 270 (PPR_Mux_Out) can be stored as previous defective address data and previous replacement address data in the previous repair memory 286.

The previous repair match logic circuit 288 can also receive the current address data Address_Lat[N:0] from the first volatile memory element 212. The previous repair match logic circuit 288 can determine whether the current address data Address_Lat[N:0] has been repaired during an operation to access the memory array 220. The previous repair match logic circuit 288 can compare the current address data Address_Lat[N:0] and the previous defective address data from the previous repair memory 286. If the current address data matches the previous defective address data, then a signal indicating the match (match signal Match) is asserted and also sent to the redundant section logic circuit 284.

The signal indicating the match, match signal Match indicates that the current address, Address_Lat[N:0], matches a defective memory cell in the memory array 220. This can cause the row decoder 218 of FIG. 2B to select a row based on the replacement address data Redundant Section[M:0] instead of the current address data Address_Lat[N:0]. Also, along with receipt of the signal indicating the match, the redundant section logic circuit 284 may also receive the replacement address data associated with the defective address data from the previous repair memory 286 and provide the replacement address data Redundant Section [M:0] to the row decoder 218 of FIG. 2B when the signal indicating the match is asserted.

Figure 3:
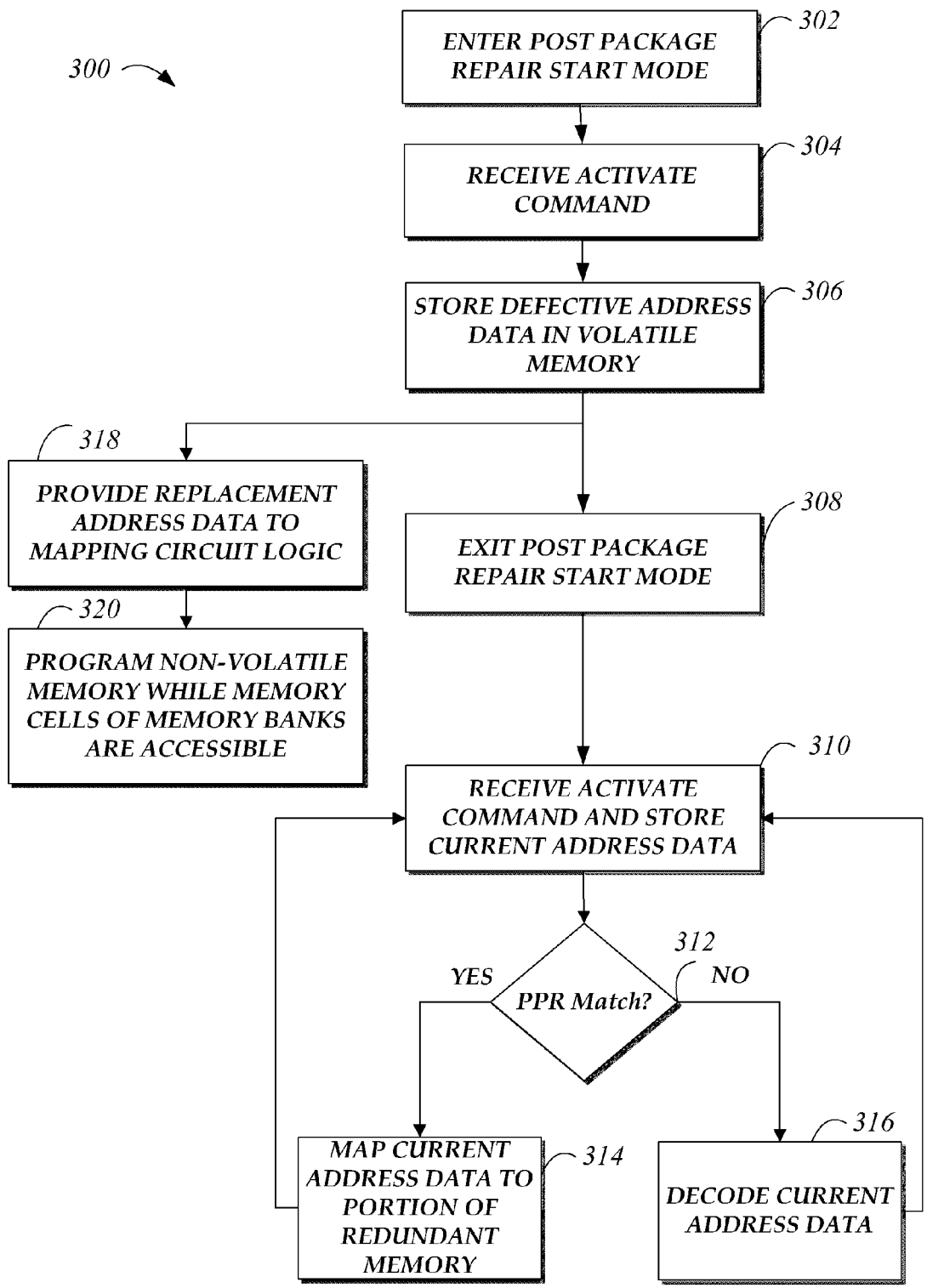
FIG. 3 is a flow diagram of an illustrative process of performing hybrid post package repair, according to an embodiment.

FIG. 3 is a flow diagram of an illustrative process of performing hybrid post package repair, according to an embodiment. The process 300 of hybrid post package repair may be implemented by the memory device 110 of FIG. 1, for example. In one embodiment, the process 300 is performed as part of a power up sequence of the memory device and/or in response to an instruction received by the global control logic 106. Any combination of the features of the process 300 may be embodied in code stored in a non-transitory computer readable storage. When executed, the code stored in non-transitory computer readable storage may cause some or all of any of the process 300 to be performed. It will be understood that any of the methods discussed herein may include greater or fewer operations and that the operations may be performed in any order, as appropriate.

At block 302, the post package repair start mode may be entered. The post package repair start mode may be entered responsive to a hybrid post package repair command received by the global control logic 106.

At block 304, an activate command may be issued by the global control logic 106 to the memory banks at block 304. Defective address data may be provided to the access logic of the memory banks with the activate command. The defective address data may be currently mapped to a group of "regular" memory cells or might have already been remapped to a group of redundant memory cells.

At block 306, the defective address data may be stored in the volatile memory of the access logic of the memory banks. More than one defective address may be stored in the volatile memory of the access logic of the memory banks during the post package repair start mode such that multiple defective portions of the memory bank may be repaired by hybrid post package repair.

At block 318, replacement address data is provided to the mapping logic circuit from the global control logic. Block 318 may occur after and/or while the defective address data is stored in the volatile memory of the access logic of a memory bank. In certain embodiments, block 318 may be executed automatically in response to a soft post package repair command for soft post package repair to occur using volatile memory as discussed above. For example, block 318 may be implemented as part of a second post package repair command for initiation of hard post package repair after issuing a first post package repair command for initiation of soft post package repair for memory cells of a particular memory bank of the memory device.

At block 320, the mapping logic circuit may program the replacement address data in non-volatile memory in performance of hybrid post package repair. As discussed above, programming the replacement address data in the non-volatile memory may be performed to remap the address data in the non-volatile memory from defective memory cells to functional redundant memory cells. For example, address data in the non-volatile memory that identifies defective memory cells may be replaced with address data that identifies functional redundant memory cells in the non-volatile memory. Programming the replacement address data in the non-volatile memory may occur subsequent to storing the defective address data in the volatile memory while the memory cells of the memory bank referenced by the address data are accessible.

Although block 318 is illustrated as being executed in parallel to block 308 (discussed further below), block 318 may alternatively be executed after block 308. Furthermore, although blocks 318 and 320 are illustrated as being executed in parallel to blocks 308-316, blocks 318 and/or 320 may be executed after (in addition to being executed in parallel) to the execution of blocks 308-316.

At block 308, the post package repair start mode may be exited after the defective address data is stored in the volatile memory of the access logic (and before, while or after the mapping logic circuit programs the non-volatile memory at block 320).

During operation of the memory device, memory cells may be accessed as memory access operations may be performed responsive to inputs received at one or more externally accessible nodes of the package of the memory device. The memory access operations may include access operations such as read or write operations. As part of the memory access operations, an activate command may be received. The activate command may be received with current address data corresponding to an address of the memory cells to be accessed at block 310. The current address data may also be stored in volatile memory of a storage element at block 310.

At block 312, current address data corresponding to the address of the memory cells to be accessed may be compared to the addresses provided by defective address data (which may include address data corresponding to multiple defective memory cells) to determine whether there is a post package repair match. A post package repair match occurs when the address of the memory cells to be accessed matches an address from defective address data stored in the volatile memory of the access logic of one of the memory banks (as discussed in connection with soft post package repair).

At block 314, the address data corresponding to the current address data may be mapped from defective memory cells to functional redundant memory cells. A row decoder 218 may perform such mapping as discussed in connection with FIG. 2A. The row decoder 218 may also override an address provided by replacement address data of the non-volatile memory. For example, as discussed in connection with FIG. 2A, soft post package repair may take priority over hard post package repair when the address as provided by hard post package repair matches a defective address stored in the first volatile memory element 212. This can account for the case when hard post package repair at the non-volatile memory 102 has not yet completed but soft post package repair has been completed. The process may then continue at block 310.

On the other hand, when the current address data does not match an address provided by defective address data in the storage element at block 312, a post package repair match is not present. In that case, the address (provided by the current address data) may be decoded by a decoder at block 316. The decoder may select a group of memory cells of the memory array mapped to the address. The selected group of memory cells of the memory array may be either a group of regular memory cells or a group of redundant memory cells of the memory array. The process may then continue at block 310.

As introduced above, although blocks 310-316 are illustrated as being executed in parallel to block 320, blocks 310-316 may be executed prior to (in addition to being executed in parallel) to the execution of block 320. Furthermore, as illustrated, blocks 310-316 may be executed several times.

Figure 4:
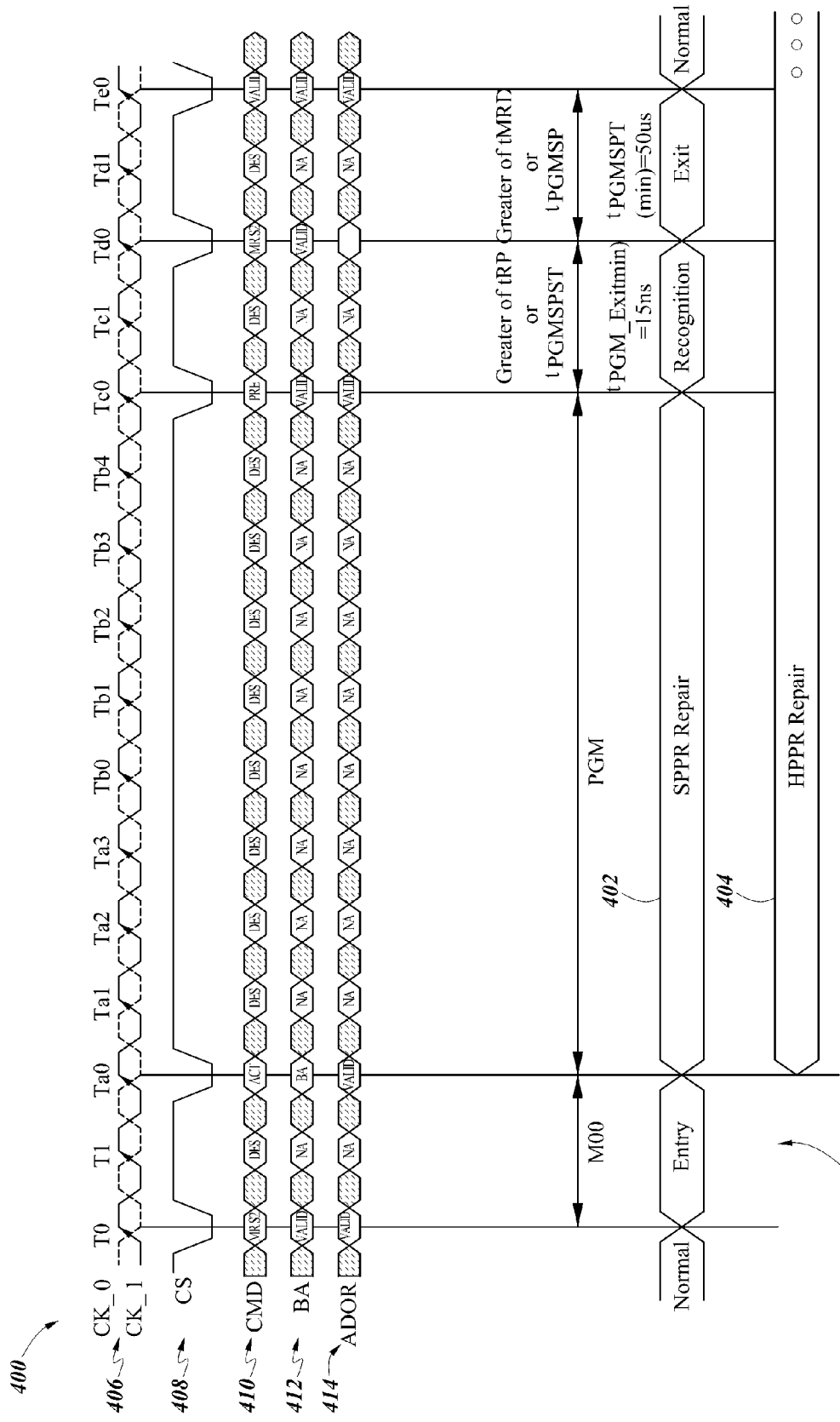
FIG. 4 is a timing diagram of hybrid post package repair, according to an embodiment.

FIG. 4 is a timing diagram 400 of hybrid post package repair processes, according to an embodiment. The timing diagram 400 illustrates how both soft post package repair 402 using volatile memory may be performed and hard post package repair 404 with non-volatile memory can occur in the background. The timing diagram illustrates various clock settings relative to certain functionalities of the memory device, such as for clock pulses 406, chip select 408, command bus 410, bank address 412 and row addresses 414. Also, as illustrated, a time period 416 may elapse as the value in the mode register is programmed prior to initiation of soft post package repair and hard post package repair. Furthermore, because the hard post package repair 404 takes significantly longer to implement than soft post package repair 402, the hard post package repair 404 will continue after soft post package repair 402 using volatile memory has already completed. Accordingly, post package repair can quickly be implemented and replacement address data can be programmed to persistent memory while the memory device proceeds with regular operation.

The principles and advantages described above may apply to various apparatuses including semiconductor devices or components. Examples of such apparatuses may include, but are not limited to, consumer electronic products, electronic circuits, electronic circuit components, parts of the consumer electronic products, electronic test equipment, etc. Examples of such apparatuses may also include memory chips, memory modules such as dual-inline memory modules (DIMMs), receiver circuits of optical networks or other communication networks, and disk driver circuits. Consumer electronic products may include, but are not limited to, a mobile phone, a smart phone, a telephone, a television, a computer monitor, a computer, a hand-held computer, a tablet computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, apparatuses may include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above may be combined to provide further embodiments. In addition, certain features shown in the context of one embodiment may be incorporated into other embodiments as well. Accordingly, the scope of the present invention is defined only by reference to the appended claims.

What is claimed is:

1. An apparatus comprising:
an integrated circuit comprising:
memory cells arranged in a plurality of portions including a first portion and a second portion;
volatile memory configured to store defective address data corresponding to the first portion of the memory cells that are deemed defective post-packaging;
a decoder configured to select the second portion of the memory cells instead of the first portion of the memory cells when a received address matches the defective address data stored in the volatile memory;
non-volatile memory; and
a mapping logic circuit, the mapping logic circuit configured to program replacement address data associated with the first portion of the memory cells to the non-volatile memory subsequent to the defective address data being stored to the volatile memory.

2. The apparatus of claim 1, further comprising a package encapsulating the integrated circuit, wherein the defective address data is received at an externally accessible node of the package.

3. The apparatus of claim 1, wherein the mapping logic circuit is further configured to program the replacement address data to the non-volatile memory while the second portion of the memory cells is accessible when the received current address data matches the defective address data.

4. The apparatus of claim 1, wherein the mapping logic circuit is further configured to program the replacement address data to the non-volatile memory by remapping replacement address data in the non-volatile memory from defective memory cells to functional redundant memory cells.

5. The apparatus of claim 1, wherein the mapping logic circuit is further configured to program the replacement address data to the non-volatile memory while the defective address data corresponding to the first portion of the memory cells are stored in the volatile memory.

6. The apparatus of claim 1, wherein
the non-volatile memory comprises fuse elements, the fuse elements comprises at least one of fuses or anti-fuses, and
the mapping logic circuit comprises a state machine.

7. The apparatus of claim 1, wherein the decoder is further configured to prevent the first portion of the memory cells from being selected when the received current address data matches the defective address data stored in the volatile memory.

8. The apparatus of claim 1, wherein the first and second portions of memory cells comprise portions of redundant memory cells of the memory cells.

9. A memory device comprising:
a plurality of memory banks, each of the plurality of memory banks comprising rows of memory cells;
volatile memory configured to store defective address data identifying a row of the memory cells to be replaced in a particular memory bank responsive to entering a post-package repair mode;
non-volatile memory in communication with each memory bank of the plurality of memory banks; and
a mapping logic circuit configured to program replacement address data corresponding to a row of the memory cells to the non-volatile memory while the memory cells of the particular memory bank are accessible.

10. The memory device of claim 9, further comprising a package encapsulating the plurality of memory banks, the volatile memory, and the mapping logic circuit.

11. The memory device of claim 9, further comprising global control logic configured to provide the defective address data to the mapping logic circuit and the non-volatile memory.

12. The memory device of claim 11, wherein the non-volatile memory, the plurality of memory banks and the global control logic are connected via a bus.

13. The memory device of claim 9, wherein each of the plurality of memory banks comprise a decoder configured to receive current address data corresponding to a selected row of memory to be accessed and select a redundant row of memory different than the selected row of memory to be accessed when the current address data matches the defective address data stored in the volatile memory.

14. The memory device of claim 9, wherein the memory device is configured to perform post package repair on a memory bank by memory bank basis.

15. The memory device of claim 9, wherein the memory device comprises at least one of a dual inline memory module or a memory card.

16. The memory device of claim 9, wherein the defective address data stored in volatile memory is received from the non-volatile memory.

17. An electronically-implemented method for post-package repair of a packaged memory device, the method comprising:
responsive to a post package repair command, storing first address data in volatile memory of the packaged memory device, the first address data corresponding to an address mapped to a first group of memory cells of the memory device that are designated for replacement;
accessing a second group of memory cells responsive to address data received by the packaged memory device corresponding to the first address data stored in the volatile memory; and
responsive to the post package repair command, programming replacement address data associated with the first group of memory cells to non-volatile memory.

18. The method of claim 17, wherein the first address data is defective address data.

19. The method of claim 17, wherein the programming the replacement address data to the non-volatile memory occurs while the memory cells of the memory device are accessible.

20. The method of claim 17, further comprising storing the first address data in the volatile memory responsive to powering up the packaged memory device.

21. The method of claim 17, wherein the programming the replacement address data to the non-volatile memory occurs by remapping stored address data in the non-volatile memory from defective memory cells to functional redundant memory cells.

22. The method of claim 17, wherein the programming the replacement address data to the non-volatile memory is initiated while the storing first address data occurs in the volatile memory.

23. The method of claim 17, wherein the programming the replacement address data to the non-volatile memory occurs after the storing first address data is initiated in the volatile memory.

24. The method of claim 17, wherein the storing first address data in volatile memory comprises:

storing first defective address data received from a global control logic circuit in a first volatile memory element of the volatile memory, and storing second defective address data received from the non-volatile memory in a second volatile memory element of the volatile memory.

25. The method of claim 24, wherein the second defective address data is received from the non-volatile memory via a bus connecting the second volatile memory element to the non-volatile memory.

26. The method of claim 24, wherein the group of memory cells of the memory device that are deemed defective are memory cells deemed defective by the first defective address data but not deemed defective by the second defective address data.

27. The method of claim 17, wherein the storing first address data in volatile memory of the packaged memory device occurs prior to the programming the first address data to non-volatile memory.

28. The method of claim 17, wherein the storing first address data in volatile memory of the packaged memory device occurs at least partly in parallel with the programming the first address data to non-volatile memory.

* * * * *